(12) United States Patent
Tsai et al.

(10) Patent No.: US 10,651,003 B2
(45) Date of Patent: May 12, 2020

(54) ION IMPLANTING METHOD

(71) Applicant: TAIWAN SEMICONDUCTOR MANUFACTURING CO., LTD., Hsinchu (TW)

(72) Inventors: Ming-Ying Tsai, Hsinchu (TW); Ming-Hui Li, Taichung (TW); Chia-Cheng Liu, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/362,761

(22) Filed: Nov. 28, 2016

(65) Prior Publication Data

US 2018/0151369 A1    May 31, 2018

(51) Int. Cl.
*H01J 37/00* (2006.01)
*H01L 21/265* (2006.01)

(52) U.S. Cl.
CPC .......... *H01J 37/00* (2013.01); *H01L 21/2658* (2013.01); *H01L 21/26506* (2013.01)

(58) Field of Classification Search
CPC . H01L 21/0257–02584; H01L 21/0415; H01L 21/046–047; H01L 21/2253; H01L 21/265–266; H01L 21/3115–31155; H01L 21/3215–32155; H01L 21/425–426; H01L 21/76825; H01L 21/76859; H01L 21/76862; H01L 21/7686
See application file for complete search history.

(56) References Cited

U.S. PATENT DOCUMENTS

| | | | | |
|---|---|---|---|---|
| 2008/0248636 A1* | 10/2008 | Olander | ................... | H01J 37/08 438/515 |
| 2009/0162996 A1* | 6/2009 | Ramaswamy | ...... | H01L 21/2253 438/477 |
| 2013/0137251 A1* | 5/2013 | Liou | .................. | H01L 21/76224 438/514 |
| 2015/0375275 A1* | 12/2015 | Chan | ..................... | B08B 7/0057 134/1 |

* cited by examiner

*Primary Examiner* — Thanh Y. Tran
(74) *Attorney, Agent, or Firm* — McClure, Qualey & Rodack, LLP

(57) ABSTRACT

An ion implanting method includes providing a gas having a bonding energy ranged from about 220 kJ/mol to about 450 kJ/mol; ionizing the gas to form a plurality of types of ions; and directing at least one of the types of the ions to implant a substance. The gas includes at least one of $N_2H_4$, $CH_3N_2H_3$, $C_6H_5N_2H_3$, $CFCl_3$ and $C(CH3)_3F$.

20 Claims, 7 Drawing Sheets

ION IMPLANTING METHOD

BACKGROUND

Ion implantation is a typical technique for fabricating semiconductor devices. Ion implantation may be used to change the electronic properties of semiconductor devices by adding specific impurities (i.e., dopants) to the target regions of semiconductor substrates. To be specific, in conventional ion implantation, a desired ion species to be implanted into the wafer may be ionized by electrons emitted by an electrode, accelerated to a predetermined kinetic energy, and directed as an ion beam towards the surface of the semiconductor substrate loaded in an ion implantation chamber. Because of the kinetic energy of ions, the desired ion species may penetrate into the semiconductor substrate to a certain depth. As such, the desired ions may be embedded (i.e., implanted) into the semiconductor substrate, which may thereby change the electrical properties of the semiconductor devices. However, conventional ion implantation techniques have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
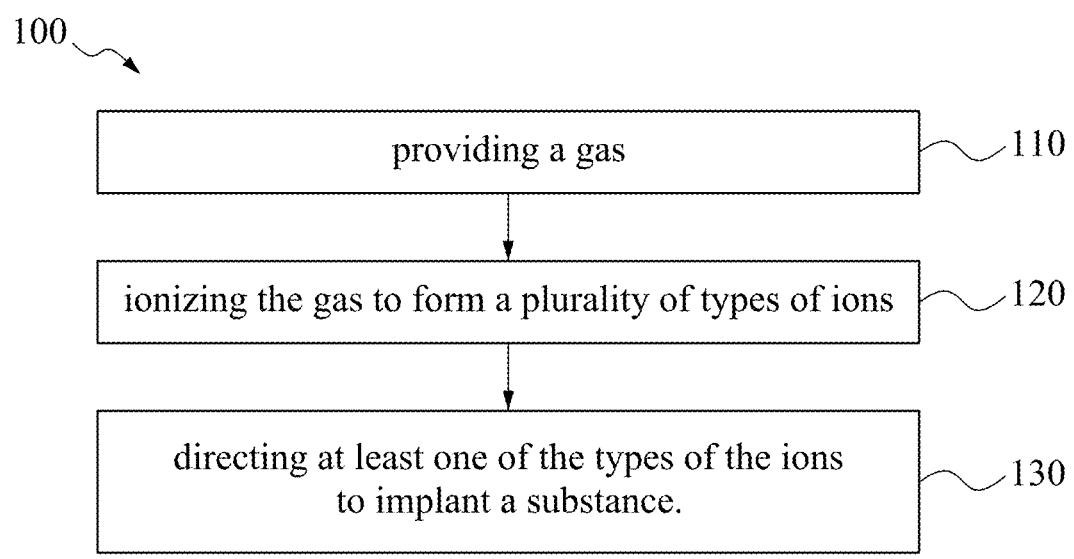
FIG. 1 is a flowchart illustrating a method of ion implantation according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In typical ion implantation processes, gas or gases such as $BF_2$, $BF_3$, $N_2$, and the like are used for the ion sources. Typical ion implantation process suffers several issues such as low throughput and/or low duration lifetime of the electrodes of the implantation apparatus. The inventor of this disclosure has discovered the root cause of these issues. That is, the gas or gases typically used in ion implantation have high bonding energies. Such gases with high bonding energies need high energy to be ionized, and generate a relatively weak ion beam current. Therefore, it takes a long period of time for ionization, and that unfavorably decreases the throughput of an implantation apparatus. In order to improve the throughput, the implantation apparatus may be operated at a relatively high arc voltage. However, as the implantation apparatus is operated under the high arc voltage, the electrodes of the apparatus may be damaged, and the duration lifetime of the electrodes is unfavorably decreased. In addition, gas with fluorine may react with the electrode, and form a fluoride film on the surface of the electrode. As the fluoride film on the electrode continuously grows, the resistance of the electrode increases and finally impacts the performance thereof.

The present disclosure relates generally to ion implanting methods that may improve or resolve the issues discussed above, according to some aspects of the present disclosure. Some embodiments discussed herein are related to a method of implanting dopants into a substance and/or a semiconductor substrate. In other embodiments, the methods may be used to implant dopants to specific active regions or components, such as for example n-well, p-well, lightly-doped drain (LDD) and/or source/drain features. Although embodiments hereinafter are discussed in a particular order, various other embodiments may be performed in any logical order and may include fewer or more steps described herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIG. 1 is a flowchart illustrating a method 100 of ion implantation according to some embodiments of the present disclosure. The method 100 is described with reference to FIG. 1 and in conjunction with FIGS. 3, 4A, 4B and 4C. FIGS. 3, 4A, 4B and 4C are cross sectional views illustrating various stages of the method 100 according to some embodiments of the present disclosure. It is understood that additional steps can be provided before, during, and/or after the method 100, and some of the steps described can be replaced, eliminated, and/or moved around for additional embodiments of the method 100.

Referring now to FIG. 1, the method 100 begins at operation 110 by providing or receiving a gas, which is used as dopant source material(s) in the subsequent operation(s). In various embodiments, the bonding energy of the gas is in a range of 220-450 kJ/mole, such as 230 kJ/mole, 300 kJ/mole, 350 kJ/mole or 400 kJ/mole. The gas may be a single-component gas or a gas mixture. In some embodiments, the gas includes nitrogen atoms and fluorine atoms. For example, the gas includes NF3. In some embodiments, the gas includes nitrogen atoms and hydrogen atoms. For example, the gas includes NH3 and/or N2H4. In some embodiments, the gas includes nitrogen atoms, hydrogen atoms and fluorine atoms. For example, the gas includes a mixture of NH3 and NF3 or a mixture of N2H2 and NF3. In examples, the molar ratio of NH3:NF3 or N2H2:NF3 ranges from about 0.05:1 to about 0.25:1, such as 0.10:1, 0.15:1, and 0.20:1. In some embodiments, the gas may include nitrogen atoms, hydrogen atoms and carbon atoms. For example, the gas includes CH3N2H3 or C6H5N2H3. In yet some embodiments, the gas may include fluorine atoms, chlorine atoms and carbon atoms. For example, the gas includes CFCl3. In yet some embodiments, the gas may include fluorine atoms, hydrogen atoms and carbon atoms. For example, the gas includes C(CH3)3F. In yet some embodiments, the gas includes at least one of NF3, NH3, N2H4, CH3N2H3, C6H5N2H3, CFCl3 and C(CH3)3F. Instead, the conventional dopant source materials, such as BF3 and N2, have high bonding energies ranged from 500 kJ/mole to 900 kJ/mole, and the high bonding energies result in a weak ion beam current. It also takes a long time to implant dopants to a substance because of a weak ion beam current. However, as one skilled in the art will recognize, the gases listed herein are merely illustrative and are not meant to be limiting to the embodiments, as any other suitable gases may alternatively be utilized. In various embodiments, the gas is provided as a source of dopant material.

Referring to FIG. 1, the method 100 proceeds to operation 120 by ionizing the gas to form a plurality of types of ions. In some embodiments, ion implantation apparatus generates ions by introducing electrons into a chamber filled with dopant source material (i.e., the gas), and the chamber is often referred to as an arc chamber. The electrons may be generated by thermionic emission from a resistively-heated filament, which is also referred to as a "cathode". The cathode is usually formed of tungsten or other suitable metal materials. When the cathode is applied with an arc voltage, electrons are emitted from the cathode. The energy of the emitted electrons is positively associated with the arc voltage of the cathode. The emitted electrons impact or collide with the dopant source material (i.e., the gas) so as to generate a plurality of ions (i.e., dopant ions). When the dopant source material has relatively lower bonding energy, the energy of the electrons required to ionize the dopant source material may be decreased, and therefore the required arc voltage may be decrease as well. Further, the ion beam current may be increased. In another aspect, as the dopant source material has relatively lower bonding energy, the ionization thereof may be achieved in a relatively short period of time so that the throughput of implantation procedure may be improved.

Figure 2:
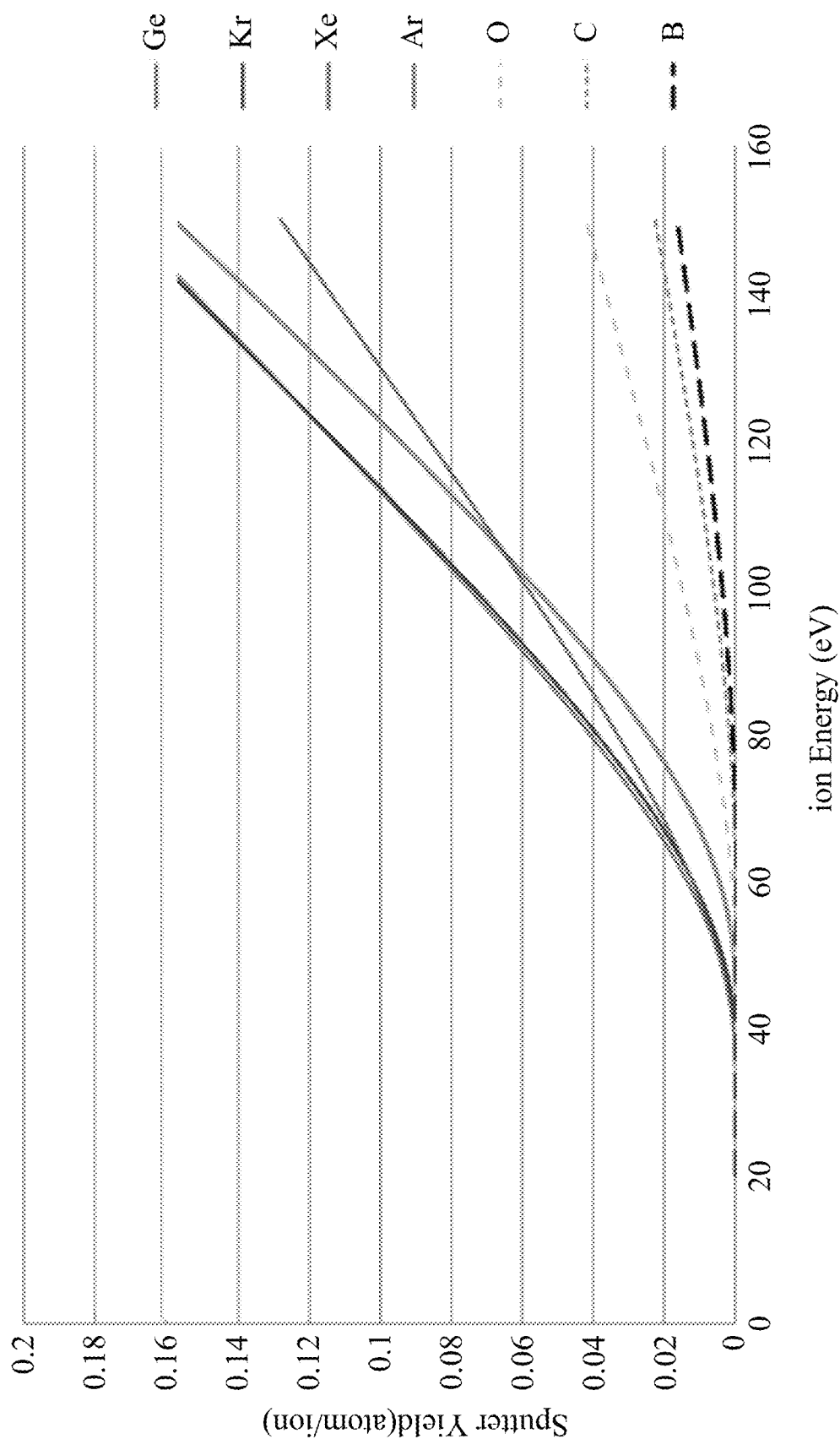
FIG. 2 is a diagram illustrating sputtering yields of various ion species colliding on a surface of tungsten material.

FIG. 2 is a diagram illustrating the sputter yields of various ion species according to some embodiments of the present disclosure. In FIG. 2, a cathode made of tungsten is employed. Various types of ions such as Ge, Kr, Xe are provided to sputter tungsten cathode. The "sputter yield" refers to the average number of tungsten atoms ejected from the surface of the cathode per incident ion. For example, a germanium ion with about 100 eV ion energy generates about 0.08 tungsten atoms ejected from the tungsten cathode. In FIG. 2, it can be observed that more tungsten atoms are ejected from the surface when the ion energy increases. This suggests that the ions with high ion energy may consume the cathode. The ion energy is positively associated with the arc voltage of the cathode. As such, the dopant source material with low bonding energy can prolong the lifetime of the cathode because a relatively lower arc voltage is applied to the cathode. Therefore, according to various embodiments of the present disclosure, the bonding energies of the gas (i.e., dopant source materials) are in a range of 220-450 kJ/mole, such as 230 kJ/mole, 300 kJ/mole, 350 kJ/mole or 400 kJ/mole.

In embodiments where the dopant source gas includes fluorine atoms, while the dopant source gas with fluorine is ionized, the generated fluorine ions reacts with the material (e.g., tungsten) of the cathode so as to form a fluoride ($WF_x$) on the surface of the cathode. When the fluoride on the surface of the cathode continues to grow, a short circuit may occur and that possibly damages the cathode. For resolving this issue, hydrogen may be introduced to the dopant source material because hydrogen may react with fluorine ions to prevent the formation of fluoride on the cathode according to some embodiments of the present disclosure. Therefore, in some embodiments, the dopant source gas may further include hydrogen. In some examples, the dopant source gas includes a mixture of $NH_3$ and $NF_3$ or a mixture of $N_2H_2$ and $NF_3$. Further, the molar ratio of $NH_3:NF_3$ or $N_2H_2:NF_3$ may be ranged from 0.05:1 to 0.25:1, such as 0.10:1, 0.15:1 or 0.20:1. In some embodiments, when the molar ratio of $NH_3$ (or $N_2H_2$):$NF_3$ is greater than 0.25:1, the amount of fluorine ions is unfavorably decreased after the ionization. In yet some embodiments, when the molar ratio of $NH_3$ (or $N_2H_2$):$NF_3$ is less than 0.05:1, the amount of hydrogen is not insufficient to prevent the formation of fluoride.

Figure 3:
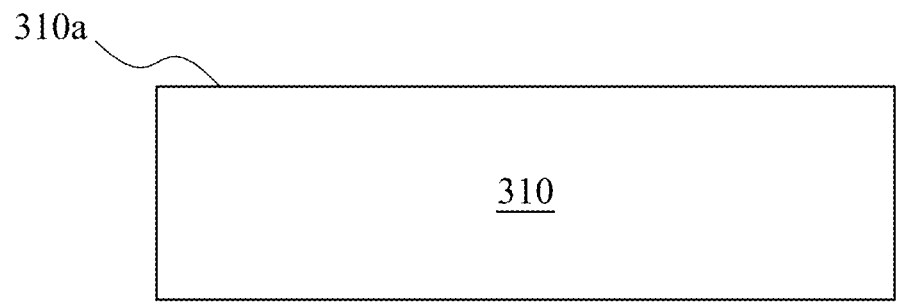
FIGS. 3, 4A, 4B and 4C are cross sectional views illustrating various stages of the method according to some embodiments of the present disclosure.
Figure 4A:
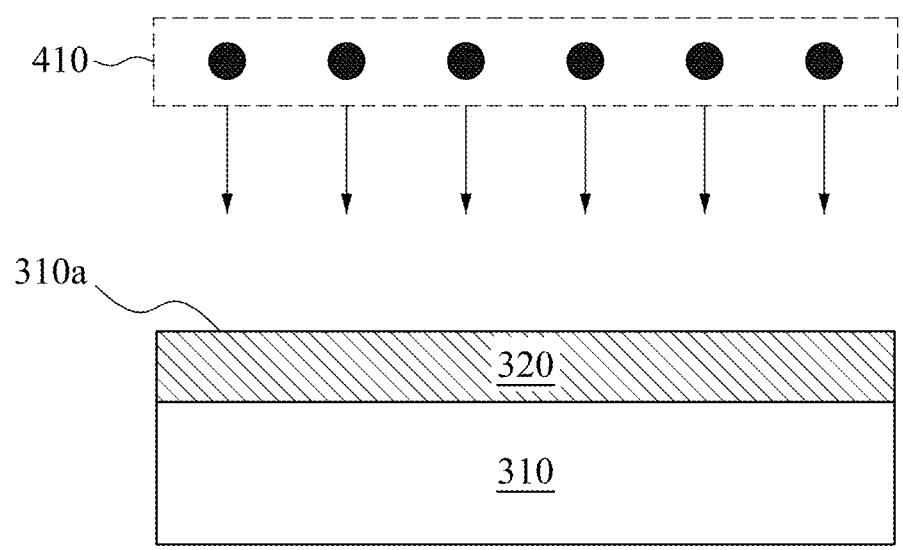

Referring to FIGS. 1, 3 and 4A, the method 100 proceeds to operation 130 by directing at least one of the types of the ions to implant a substance. FIG. 3 illustrates a substance 310 with a top surface 310a. The substance 310 has a target area to be implanted. The substance 310 may include a layer and/or a substrate (not shown in FIG. 3), certain regions in the substrate, or features (e.g., source/drain features) on the substrate. The substrate described above may be a semiconductor substrate, such as a semiconductor-on-insulator (SOI) substrate, a bulk semiconductor, or the like. Alternatively, the substrate may be a wafer, such as a silicon wafer. The SOI substrate may include a layer of a semiconductor material formed on an insulator layer. The insulator layer may be, for example, a silicon oxide layer, a buried oxide (BOX) layer, or the like. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, AlInAs, GaAsP, AlGaAs, GaInP, GaInAs and/or GaInAsP; or combinations thereof.

The substance 310 may include active devices (not shown) or passive devices (not shown) that may be used to generate the desired structural and functional parts of the design. The active devices may include a wide variety of active devices such as transistors, and the like. The passive devices, for example, may be capacitors, resistors, inductors, and the like. The active devices and passive devices may be formed using any suitable methods either within or else on the substrate 310.

FIG. 4A a cross-section view illustrating directing at least one type of the ions 410 to implant the substance 310, and forming a doped layer 320 under the top surface 310a of the substance 310 according to some embodiments of the present disclosure. In some embodiments, at least one type of fluorine ions, nitrogen ions, and carbon ions are implanted as dopants for surface modification or changing the electric properties of the doped layer 320. For example, nitrogen dopants may be used for N-type metal-oxide-semiconductor (NMOS), and fluorine dopants are used for controlling dopant profiles of other types of dopants. Carbon atoms may be used to implant source/drain features to improve the device performance.

After the ion implantation, an annealing process is performed to activate the dopants in the doped layer 320 according to some embodiments of the present disclosure. Ion implantation of impurities (i.e. dopants) disrupts the crystallinity of the doped layer 320. Therefore, an annealing process may be carried out to restore the crystallinity of the substrate and drive the implanted dopants onto electrically active crystal sites. Such annealing and/or the annealing process is sometimes also referred to as "implant annealing," "activation annealing," or "activation." In some embodiments, the annealing process includes rapid thermal annealing (RTA), laser annealing or other suitable thermal process.

Figure 4B:
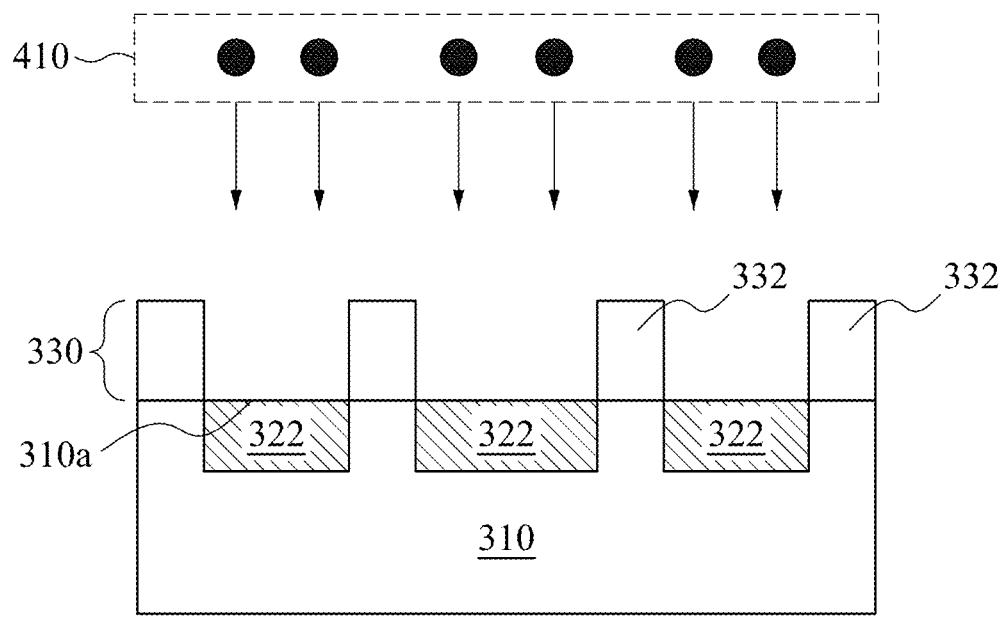

FIG. 4B is a cross-section view showing directing at least one type of the ions 410 to implant the substance 310, and forming desired doped regions 322 under the top surface 310a according to some embodiments of the present disclosure. A patterned mask 330 may be firstly formed on the substance 310. The patterned mask 330 includes a plurality of masking components 332 to prevent the underlying region to be implanted. The patterned mask can be a patterned hard mask, which is formed of titanium nitride, silicon nitride and/or silicon oxide, for example. In some embodiments, the patterned mask 330 may include a bi-layer. For example, the bi-layer includes two materials selected from titanium nitride, silicon oxide and silicon nitride. The bi-layer may be deposited by CVD process, sub-atmospheric CVD (SACVD) process, flowable CVD process, ALD process, physical vapor deposition (PVD) process, and/or other suitable process according to some embodiments. The hard mask may be patterned using a photolithography process to form a patterned photoresist layer on the hard mask and followed by an etching process to etch the hard mask through the openings of the patterned photoresist layer. The etching process may include a dry etch, a wet etch, or a combination of dry etch and wet etch. The dry etching process may use etchant such as for example fluorine-containing gas (e.g. $CF_4$, $SF_6$, $CH_2F_2$, $CHF_3$, and/or $C_2F_6$), chlorine-containing gas (e.g., $Cl_2$, $CHCl_3$, $CCl_4$, and/or BCl3), bromine-containing gas (e.g., HBr and/or $CHBR_3$), iodine-containing gas, other suitable gases and/or plasmas, and/or combinations thereof. The etching process may include a multiple-step etching to gain etch selectivity, flexibility and desired etch profile. In yet some embodiments, the patterned mask 330 may be a patterned photoresist layer formed by a photolithography process. For example, the photolithography process may include spin coating a photoresist layer overlying the substrate, exposing the photoresist to a pattern, performing a post-exposure bake process, and developing the photoresist to form a patterned photoresist layer.

After the patterned mask 330 is formed on the substance 310, a portion of the surface of the substance 310 is exposed according to some embodiments of the present disclosure. The ions are directed to implant the exposed portion of the substance 310. Some of the ions are blocked by the masking components 332. The rest of the ions implant the exposed portion of the substance through the openings or trenches in the patterned mask 330, thus a plurality of doped regions 322 are formed. After the implantation, the patterned mask 330 may be removed, such as by an acceptable ashing process or a grinding process such as chemical mechanical polishing (CMP), although any suitable removal process may be used. In some embodiments, an annealing process is then performed to activate the dopants in the doped layer 320. The annealing process includes rapid thermal annealing (RTA), laser annealing or other suitable thermal process.

Figure 4C:
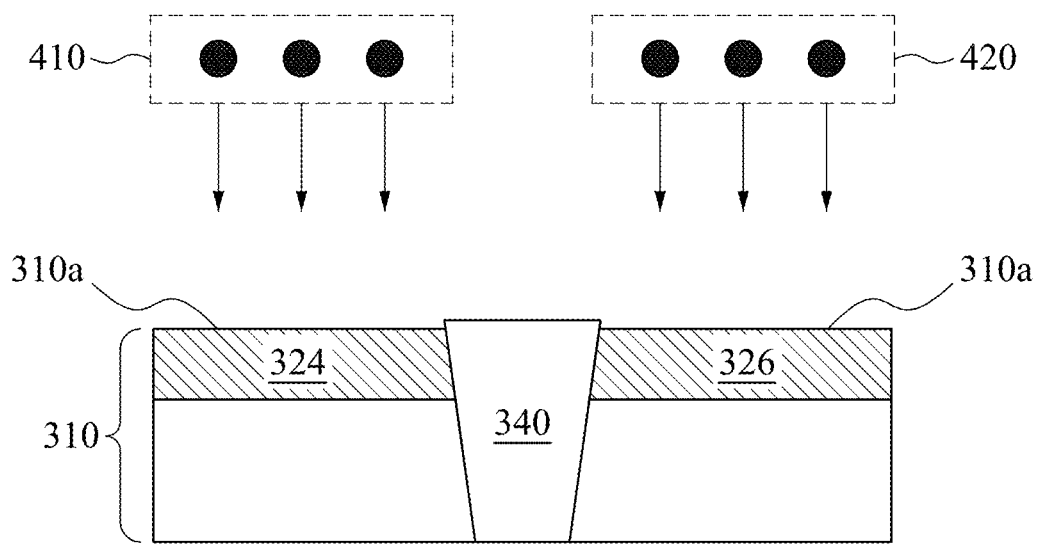

FIG. 4C depicts a cross-section view showing directing two types of the ions 410 and 420 to implant active regions 324 and 326 respectively according to some embodiments of the present disclosure. The substance 310 includes a plurality of active regions (e.g., active regions 324 and 326) and at least an isolation structure (e.g., isolation structure 340) separating two adjacent ones of the active regions. In some embodiments, the isolation structures 340 include shallow trench isolation (STI) structures formed in the substance 310 to define and separate various active regions. The formation of the isolation structure 340 may include etching a trench in the substance 310 and filling the trench by insulator materials such as silicon nitride, silicon oxide, silicon oxynitride or other suitable materials. The filled trench may have a multi-layer structure such as a thermal oxide liner layer with silicon nitride filling the trench. In some embodiment, the isolation structure 340 may be created by a process sequence such as: growing an oxide pad, forming a nitride layer, patterning an isolation structures opening using photoresist and masking, etching a trench in the semiconductor substrate, growing a thermal oxide trench liner to improve the trench interface, filling the trench with oxide material, and using chemical mechanical planarization (CMP) to remove the excessive oxide layers.

In yet some embodiments, the active region 324 is implanted by ions 410, and the active region 326 is implanted by ions 420. The ions 410 and 420 may be different types of ions or the same type of ions with different dosages. The ions 410 and 420 may be implanted in one implanting step or in different implanting steps. The different implant steps for the different regions may be achieved using a photoresist or other masks (not shown). For example, a photoresist is formed over the active region 324 and the isolation structure 340. The photoresist is patterned to expose the active region 326. The photoresist can be formed by using a spin-on technique and can be patterned using acceptable photolithography techniques. Once the photoresist is patterned, an ion implant of ions 420 is performed in the active region 326, and the photoresist may act as a mask to substantially prevent ions 420 from being implanted into the active region 324. After the implant of ions 420, the photoresist is removed, such as by an acceptable ashing process. Following the implanting of the active region 326, another photoresist (not shown) is formed over the active region 326 and the isolation structure 340. The photoresist is patterned to expose the active region 324. The photoresist can be formed by using a spin-on technique and can be patterned using acceptable photolithography techniques. Once the photoresist is patterned, an ion implant of ions 410 may be performed in the active region 324, and the photoresist may act as a mask to substantially prevent ions 410 from being implanted into the active region 326. After the implant of ions 410, the photoresist may be removed, such as by an acceptable ashing process. In some embodiments, an annealing process is then performed to activate the dopants in the doped layer 320. The annealing process includes rapid thermal annealing (RTA), laser annealing or other suitable thermal process.

Figure 5:
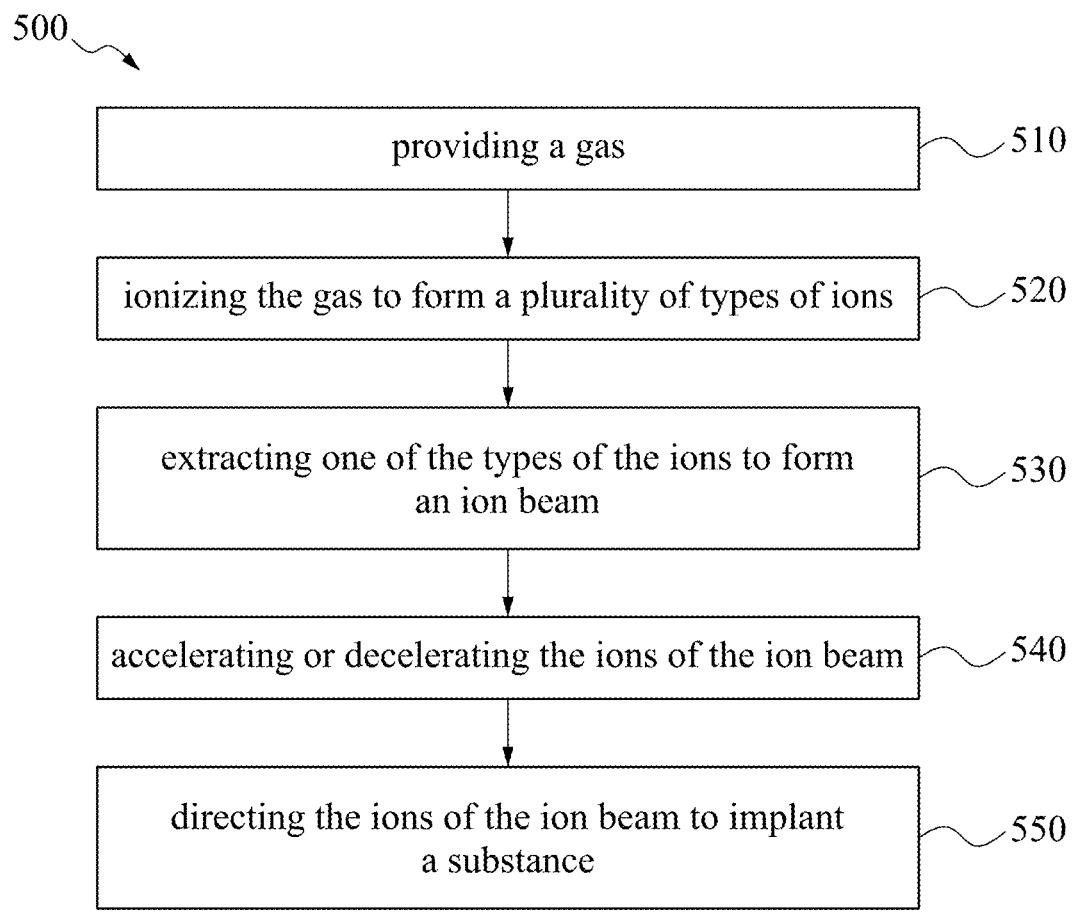
FIG. 5 is a flowchart illustrating a method of ion implantation according to some embodiments of the present disclosure.
Figure 6:
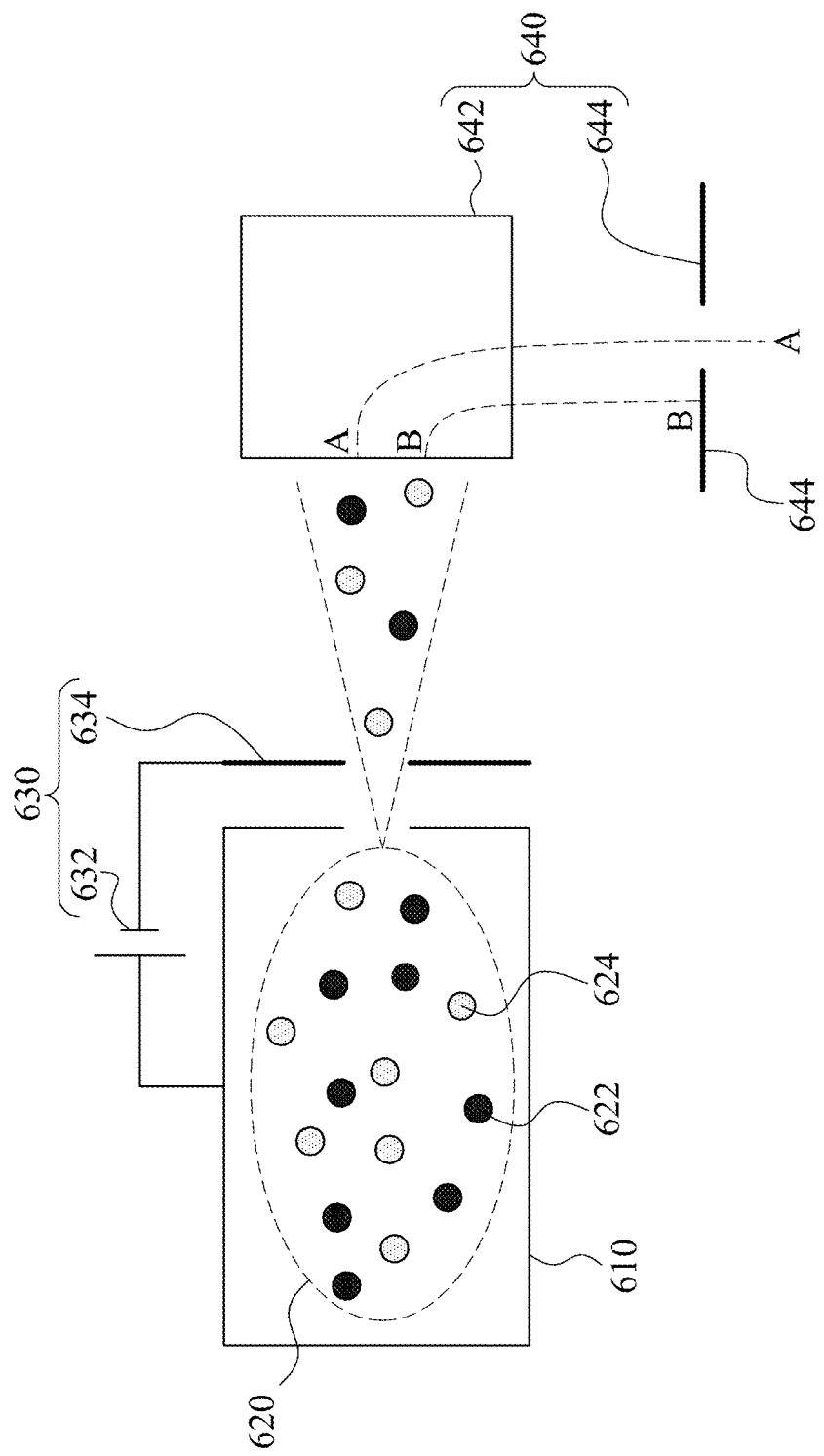
FIG. 6 is a schematic view illustrating an ion extraction utility in accordance with some embodiments of the present disclosure.
Figure 7:
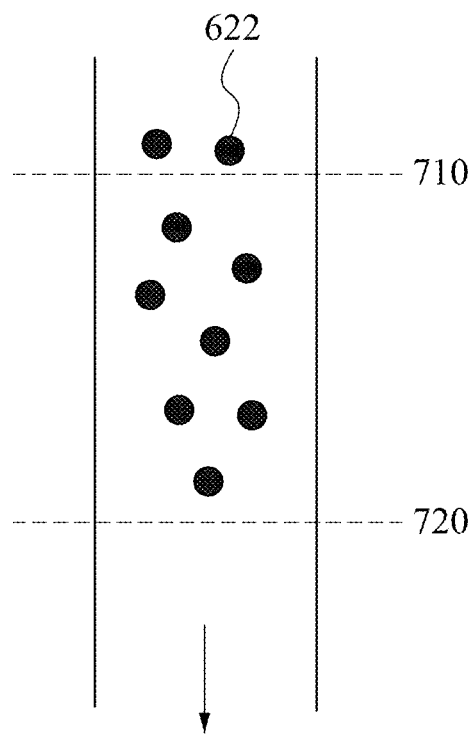
FIG. 7 is a schematic view illustrating an ion acceleration utility in accordance with some embodiments of the present disclosure.
Figure 8:
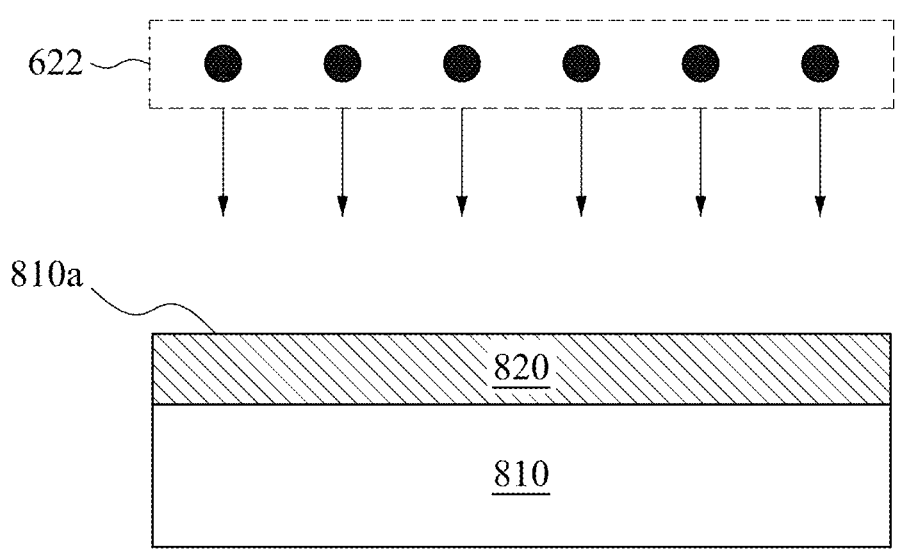
FIG. 8 is a cross-sectional view illustrating a process stage of the method according to some embodiments of the present disclosure.

FIG. 5 is a flowchart of a method 500 of ion implantation according to some embodiments of the present disclosure. The method 500 is described in conjunction with FIGS. 6, 7 and 8. FIGS. 6 and 7 are schematic views illustrating intermediate stages of ion implantation in accordance with some embodiments of the present disclosure. FIG. 8 is a cross sectional view showing implanting ions to a substance according to some embodiments of the present disclosure. It is understood that additional steps can be provided before, during, and/or after the method 500, and some of the steps described can be replaced, eliminated, and/or moved around for additional embodiments of the method 500.

Referring now to FIG. 5, the method 500 begins at operation 510 by providing or receiving a gas. In various embodiments, the bonding energy of the gas is in a range of 220-450 kJ/mole, such as 230 kJ/mole, 300 kJ/mole, 350 kJ/mole or 400 kJ/mole. The gas may be a single-component gas or a gas mixture. In some embodiments, the gas includes nitrogen atoms and fluorine atoms. For example, the gas includes $NF_3$. In some embodiments, the gas includes nitrogen atoms and hydrogen atoms. For example, the gas includes $NH_3$ and/or $N_2H_4$. In some embodiments, the gas includes nitrogen atoms, hydrogen atoms and fluorine atoms. For example, the gas includes a mixture of $NH_3$ and $NF_3$ or a mixture of $N_2H_2$ and $NF_3$. In examples, the molar ratio of $NH_3:NF_3$ or $N_2H_2:NF_3$ ranges from 0.05~0.25:1, such as 0.10:1, 0.15:1 or 0.20:1. In some embodiments, the gas includes nitrogen atoms, hydrogen atoms and carbon atoms. For example, the gas includes $CH_3N_2H_3$ or $C_6H_5N_2H_3$. In some embodiments, the gas includes fluorine atoms, chlorine atoms and carbon atoms. For example, the gas includes $CFCl_3$. In yet some embodiments, the gas includes fluorine atoms, hydrogen atoms and carbon atoms. For example, the gas includes $C(CH_3)_3F$. In yet some embodiments, the gas includes at least one of $NF_3$, $NH_3$, $N_2H_4$, $CH_3N_2H_3$, $C_6H_5N_2H_3$, $CFCl_3$ and $C(CH_3)_3F$. However, as one skilled in the art will recognize, the gases listed herein are merely illustrative and are not meant to be limiting to the embodiments, as any other suitable gases may alternatively be utilized. In various embodiments, the gas is provided as a source of dopant material.

Referring now to FIG. 5, the method 500 proceeds to operation 520 by ionizing the gas to form a plurality of types of ions. In some embodiments, ion implantation system generates ions by introducing electrons into an arc chamber filled with dopant source materials (e.g., gas). The electrons may be generated by thermionic emission from a resistively-heated filament. Collisions of these electrons with dopant source materials result in the generation of an ionized plasma including positive and negative dopant ions.

Referring to FIGS. 5 and 6, the method 500 proceeds to operation 530 by extracting one of the types of the ions to form an ion beam. FIG. 6 is a schematic view illustrating an ion extraction utility in accordance with some embodiments of the present disclosure. The ion extraction utility includes an arc chamber 610, a dopant source gas supplier (not shown), an ion attraction utility 630 and a mass analysis magnet utility 640. The arc chamber 610 is configured to ionize dopant source materials. The dopant source gas supplier is configured to supply the dopant source materials to the arc chamber 610. As shown in FIG. 6, the dopant source material may be ionized in the arc chamber 610 to form a plurality of ions 620. For examples, the ions 620 include a first type of ions 622 and a second type of ions 624. The ion attraction utility 630 may include a voltage source 632 and an electrode 634. The voltage source 632 is configured to apply a positive or a negative voltage to the electrode 634, thus directing the ions to a mass analysis magnet utility 640. The mass analysis magnet utility 640 is operable to sort out (or filter off) ions with inappropriate charge-to-mass ratios. For example, the mass analysis magnet utility 640 may include a gate 644 and a mass analysis magnet 642 for providing a magnetic field. The gate 644 may filter off ions with undesired mass-to-charge ratios. As illustrated in FIG. 6, the second type of ions 624 with inappropriate mass-to-charge ratios move along route B-B, and are blocked by the gate 644. To the contrary, the first type of ions 622 with desired mass-to-charge ratios move along a route A-A, and may pass through the aperture of the gate 644 to form an ion beam.

Referring to FIGS. 5 and 7, the method 500 proceeds to operation 540 by accelerating or decelerating the ions of the ion beam. As shown in FIG. 7, a pair of electric plates 710 and 720 are disposed parallel with each other. The electric plates 710 and 720 are capable of generating an electric field with a direction parallel to the propagating direction of ion beams. By the contribution of the electric field, the ions of the ion beam may be accelerated or decelerated. The kinetic energy (or speed) of the ions may be modulated by the intensity of the electric field, and the intensity of the electric field may be managed in terms of the desired dopant profile or implant depth.

Referring to FIGS. 5 and 8, the method 500 proceeds to operation 550 by directing the ions of the ion beam to implant a substance. FIG. 8 is a cross-section view illustrating an operation of directing at least one type of the ions 622 to implant the substance 810, and thus forming a doped layer 820 under the top surface 810a. In some embodiments, fluorine ions and/or nitrogen ions are implanted as dopants for surface modification or changing the electric properties of the doped layer 820. In some embodiments, nitrogen dopants may be used for N-type metal-oxide-semiconductor (NMOS), and fluorine dopants are used for controlling dopant profiles of other types of dopants. After the ion implantation, an annealing process may be performed to activate the dopants in the doped layer 820. In some embodiments, the annealing process includes rapid thermal annealing (RTA), laser annealing or other suitable thermal process. In some embodiments, a patterned mask (not shown) may be formed on the substance 810 to form patterned doped regions on the substance 810.

According to various embodiments of the present disclosure, the ion implanting methods provided herein are advantageous in increasing the ion beam current and the throughput of the ion implantation. Since the dopant source material has relatively lower bonding energy, the energy of the electrons required to ionize the dopant source material may be decreased, and therefore the required arc voltage may be decrease as well. Therefore, the lifetime of the cathode may be improved. In another aspect, as the dopant source material has relatively lower bonding energy, the ion beam current may be increased, and the ionization may be achieved in a relatively short period of time so that the throughput of implantation procedure may be improved. In addition, the dopant source material may include fluorine atoms, nitrogen atoms and hydrogen atoms according to some embodiments of the present disclosure. The hydrogen atoms can restrain the formation of fluoride on the cathode, thereby prolonging the lifetime of the cathode.

In accordance with one aspect of some embodiments, a method includes the following operations: providing a gas having a bonding energy ranged from about 220 kJ/mol to about 450 kJ/mol; ionizing the gas to form a plurality of types of ions; and directing at least one of the types of the ions to implant a substance.

In accordance with another aspect of some embodiments, a method includes the following operations: providing or receiving a substance; providing a gas including nitrogen atoms, fluorine atoms and hydrogen atoms; ionizing the gas to form nitrogen ions, fluorine ions and hydrogen ions; and directing at least one of the nitrogen ions, the fluorine ions, or the hydrogen ions to implant the substance.

In accordance with another aspect of some embodiments, a method includes the following operations: providing a gas having a bonding energy ranged from 220-450 kJ/mole; ionizing the gas to form a plurality of types of ions; extracting one of the types of the ions to form an ion beam; accelerating or decelerating the ions of the ion beam; and directing the ions of the ion beam to implant a substance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An ion implanting method, the method comprising:
providing or receiving a gas having a bonding energy ranged from about 220 kJ/mol to about 450 kJ/mol, wherein the gas comprises $NF_3$, $NH_3$, $N_2H_4$, $CH_3N_2H_3$, $C_6H_5N_2H_3$, $CFCl_3$, $C(CH_3)_3F$, or combinations thereof;
ionizing the gas to form a plurality of types of ions;
extracting at least one of the types of the ions from the plurality of types of ions; and
directing said at least one of the types of the ions to implant a substance such that a doped region is formed in the substance, wherein directing said at least one of the types of the ions comprises:
forming a mask layer on the substance;
patterning the mask layer to expose a portion of the substance; and
directing said at least one of the types of the ions to implant the exposed portion of the substance.

2. The ion implanting method of claim 1, wherein the gas comprises $NF_3$.

3. The ion implanting method of claim 2, wherein the gas further comprises $NH_3$.

4. The ion implanting method of claim 1, wherein the gas comprises $NH_3$.

5. The ion implanting method of claim 1, further comprising annealing the implanted substance after directing said at least one of the types of the ions.

6. The ion implanting method of claim 1, wherein the bonding energy is ranged from about 230 kJ/mol to about 350 kJ/mol.

7. The ion implanting method of claim 1, wherein extracting the at least one of the types of the ions comprises accelerating the at least one of the types of the ions.

8. The ion implanting method of claim 1, wherein extracting the at least one of the types of the ions comprises decelerating the at least one of the types of the ions.

9. The ion implanting method of claim 1, wherein the gas comprises $NH_3$ and $NF_3$ and a molar ratio of $NH_3:NF_3$ ranges from about 0.05:1 to about 0.25:1.

10. An ion implanting method, comprising:
providing or receiving a substance;
providing a gas comprising nitrogen atoms, fluorine atoms and hydrogen atoms, wherein the gas includes $NH_3$ and $NF_3$ and a molar ratio of $NH_3:NF_3$ ranges from about 0.05:1 to about 0.25:1;
ionizing the gas to form nitrogen ions, fluorine ions and hydrogen ions; and
directing at least one of the nitrogen ions and the fluorine ions to implant the substance.

11. The ion implanting method of claim 10, wherein the gas has a bonding energy ranged from about 220 to about 450 kJ/mol.

12. The ion implanting method of claim 10, wherein directing said at least one of the types of the ions comprises:
forming a mask layer on the substance;
patterning the mask layer to expose a portion of the substance; and
directing said at least one of the types of the ions to implant the exposed portion of the substance.

13. The ion implanting method of claim 10, wherein the substance comprises a plurality of active regions and an isolation structure separating two adjacent ones of the active regions, wherein directing said at least one of the types of the ions comprises:
directing said at least one of the types of the ions to the active regions to implant the active regions.

14. The ion implanting method of claim 10, further comprising annealing the implanted substance after directing said at least one of the types of the ions to implant the substance.

15. The ion implanting method of claim 10, further comprising extracting the nitrogen ions or the fluorine ions.

16. An ion implanting method, comprising:
providing or receiving a gas having a bonding energy ranged from about 220 to about 450 kJ/mol, wherein the gas comprises $NF_3$ and $NH_3$, and a molar ratio of $NH_3:NF_3$ ranges from about 0.05:1 to about 0.25:1;
ionizing the gas to form a plurality of types of ions;
extracting one of the types of the ions to form an ion beam;
accelerating or decelerating the ions of the ion beam; and
directing the ions of the ion beam to implant a substance such that a doped region is formed in the substance.

17. The ion implanting method of claim 16, wherein directing said at least one of the types of the ions comprises:
forming a mask layer on the substance;
patterning the mask layer to expose a portion of the substance; and
directing said at least one of the types of the ions to implant the exposed portion of the substance.

18. The ion implanting method of claim 16, wherein the gas comprises nitrogen atoms, hydrogen atoms and carbon atoms.

19. The ion implanting method of claim 16, wherein the gas further comprises $CH_3N_2H_3$ or $C_6H_5N_2H_3$.

20. The ion implanting method of claim 16, wherein the gas further comprises $N_2H_4$, $CH_3N_2H_3$, $C_6H_5N_2H_3$, $CFCl_3$ and $C(CH_3)_3F$.

* * * * *